United States Patent [19]
Gartner et al.

[11] Patent Number: 5,254,832
[45] Date of Patent: Oct. 19, 1993

[54] METHOD OF MANUFACTURING ULTRAFINE PARTICLES AND THEIR APPLICATION

[75] Inventors: Georg Gartner, Aachen; Hans Lydtin, Stolberg, both of Fed. Rep. of Germany

[73] Assignee: U.S. Philips Corporation, New York, N.Y.

[21] Appl. No.: 642,241

[22] Filed: Jan. 8, 1991

[30] Foreign Application Priority Data

Jan. 12, 1990 [DE] Fed. Rep. of Germany ....... 4000690

[51] Int. Cl.$^5$ .................................. B23K 26/00
[52] U.S. Cl. .................. 219/121.66; 219/121.69; 219/121.84; 427/561; 427/596
[58] Field of Search .................. 219/121.82, 121.84, 219/121.65, 121.66, 121.68, 121.69; 427/53.1

[56] References Cited

U.S. PATENT DOCUMENTS 4,619,691 10/1986 Araya et al. ..................... 75/0.5 B
5,049,406 9/1991 Geittner et al. ..................... 427/53.1

Primary Examiner—C. L. Albritton
Attorney, Agent, or Firm—William L. Botjer

[57] ABSTRACT

Ultrafine particles (9) are produced from a target 30) by laser beam evaporation. The laser beam (1) is directed to the target in such a manner that the removal of the target material takes place in the direction of movement of the laser beam. The ultrafine particles thus manufactured are preferably used for the manufacture of single or multi-component materials or moulded bodies from such materials; by coating substrates (15) with said ultrafine particles.

21 Claims, 5 Drawing Sheets

METHOD OF MANUFACTURING ULTRAFINE PARTICLES AND THEIR APPLICATION

BACKGROUND OF THE INVENTION

The invention relates to a method of manufacturing ultrafine particles which are produced from a target by laser beam evaporation, and the use of the ultrafine particles thus manufactured.

Ultrafine particles are to be understood to mean herein, particles having diameters in the range from 1 to 100 nm; consequently, such particles are smaller than particles of conventional fine powders and larger than clusters of atoms (Chikara Hayashi, J. Vac. Sci. Technol. A5 (4), July/August 1987, pp. 1375–1384, and Physics Today, December 1987, pp. 44–51).

According to Hayashi in the above publication, ultrafine particles can be used:
- in dyes, pigments, adhesives and catalysts,
- for ultrafine particles of $Al_2O_3$, carburated tungsten, $Si_3N_4$ and other heat and acid-resistant carbides and nitrides of active metals and rare earth metals in tools, ceramic and heat-resistant materials,
- for dispersion hardening, in which process ultrafine particles are dispersed in a host material and the mixture is sintered or exposed to the action of a catalyst,
- in aerosols for use in agriculture, forestry, military technologies and medicine,
- for ultrafine particles of magnetic alloys in magnetic recording materials, for example sound recording tapes and video tapes, and
- in microbiology.

According to Hayashi, ultrafine particles are manufactured using induction-heated crucibles, in arc furnaces, Hayashi prefers the GEM method (Gas Evaporation Method), i.e. evaporation and condensation in a permanent gas.

Hayashi further describes the flotation and transport of ultrafine particles in a gas flow as well as a gas-coating method in which a high-speed gas flow entraining ultrafine particles impinges on a substrate at a low pressure of, for example, 1 hPa.

In U.S. application Ser. No. 4,619,691, a description is given of a method of manufacturing ultrafine particles by irradiating a surface of a material with a laser beam. When the radiation process is carried out in a properly selected gas atmosphere, for example, in oxygen, nitrogen, dichlorodifluoromethane, methane or propane, ultrafine particles having a desired composition are obtained, said composition being either the same as that of the irradiated material or different. The particle size distribution is adjusted through the pressure of the gas atmosphere, said pressure not exceeding 1000 hPa. When titanium is irradiated at a pressure of 1000 hPa, ultrafine particles having a diameter in the range from 5 to 65 nm are obtained, at a pressure of 130 hPa particles are obtained having a uniform diameter of 5 nm. The power density of the laser beam ranges between $10^4$ and $10^7$ W/cm$^2$. Additional energy may be supplied to the irradiated material, for example, by means of an arc, a glow discharge or electron beams.

DE-A-3800680 describes a method of coating a substrate in a vacuum chamber, in which method a target is evaporated by means of a laser beam and the precipitate is used to coat the substrate, the laser beam being led into the vacuum chamber through an optical window, and the deposition of the precipitate on the window inside the vacuum chamber being precluded by means of a gas plume. The pressure in the vacuum chamber generally ranges between $10^{-2}$ and $10^{-6}$ hPa. An inert gas or, at least partly, a reactive gas which combines with the evaporated particles of the target to form a new chemical compound and, hence, becomes a constituent of the coating, can be selected as the gas for the gas plume. Materials having different melting and evaporation temperatures can evaporate side by side and be used as coating materials. The target is present either as a solid mixture or as a powder which is composed of a mixture of materials. A uniform wear and a regulation of the quantity evaporated per unit of time can be controlled by moving the target. By moving the target, always fresh materials are exposed to the laser beam and the burning of holes in the target is precluded. Ionization of the vapours to be used for coating and the accompanying inert gases is very advantageous for the transport of the evaporated particles from the target to the substrate. To enhance ionization, a low-pressure plasma can be formed at the location where evaporation of the target takes place and/or in the region of the substrate, said low-pressure plasma being maintained by, for example, a glow discharge. To further enhance the transport of evaporated particles on the substrate, the latter may be negatively charged.

The processing of laser material in a high vacuum as described in DE-A-3800680 results in particles of a very unspecific size, i.e. particles in the range above 1 $\mu$m as well as molecules themselves. Further, a sufficiently high mass flow cannot be attained in said high vacuum.

SUMMARY OF THE INVENTION

It is an object of the invention to improve the manufacture of ultrafine particles, in particular, to ensure that the target material is substantially completely removed and, thus, used more effectively.

In accordance with the invention, this object is achieved in that the laser beam is directed to the target in such a manner that the removal of the target material takes place in the same direction as the direction of movement of the laser beam.

In the method according to the invention, target material on which the laser beam impinges is completely removed in the direction of radiation, the largest part of the beam interacting with the target, so that only a small part passes directly through the target or by-passes it. Consequently, both a penetration of the target and a removal of material at the periphery may take place when the laser beam is moved relative to the target in the peripheral zone of the target and along the edge therof, and the edge of the target is completely removed when the laser parameters such as power, power density and relative velocity are suitably adjusted. The thickness of the target should not exceed a few mm, typically it should be 1 to 5 mm.

A variant of the method according to the invention consists in that the ultrafine particles which are being evaporated flow off through a hole in the target and, if desired, pass through an additional diaphragm.

Efficaciously, the surface of the target is roughened, ground or oxidized before the removal operation starts, or a porous moulded body is used as the target. This will be explained below.

A further embodiment of the method according to the invention consists in that various material components are evaporated simultaneously and ultrafine particles are subsequently produced therefrom.

To avoid or reduce retrograde condensation of the ultrafine particles and thermomechanical stresses, the target is efficaciously heated directly or indirectly (for example by resistance heating, induction heating or laser beam heating).

Laser beam evaporation from the target preferably takes place in front of, in or behind the focus of a focused beam, focusing taking place inside or outside a target chamber, preferably, through a spherical focusing mirror which is rinsed with an inert gas.

In particular in the case of ceramic materials it is advantageous for the laser beam to exhibit a power profile on the target surface, which consists of a narrow region of material removal with a high power and a wider heating region with a lower power.

The ultrafine particles are transferred to a collecting chamber or a substrate, preferably, by using a generally inert transport gas and, if necessary, an intermediate size selection.

The ultrafine particles preferably have a size distribution with a standard deviation of maximally 10% from the average diameter, or only selected particles of said size distribution, including their agglomerates, reach the collecting chamber or the substrate.

The desired dosage of the ultrafine particles is preferably obtained by adjusting the laser-power density on the target surface, the size of the spot, the relative velocity between target and laser beam, the overall pressure in the target chamber and/or by dividing the carrier gas flow, the above values advantageously being kept constant throughout the process.

The overall pressure in the target chamber is preferably adjusted to be so low that the highest value on the scale of sizes coincides with the particle size to be selected. For example, for particle sizes of 10 nm or smaller the pressure is, preferably, adjusted at maximally 20 hPa, in particular 10 to 1 hPa.

To preclude the formation of an agglomeration, it is efficacious to give the ultrafine particles charges of the same sign, and in the case of oxidic particles or insulators, said particles or insulators are preferably previously coated with, respectively, a thin, only a few monolayers thick, electrically conducting or metallic surface layer.

The material component enveloping the ultrafine particles is, preferably, a material whose solid solubility in the particle material is negligibly small, as a result of which the size-dependent properties of the ultrafine particles in the solid body are stabilized.

The ultrafine particles manufactured in accordance with the invention, can be used for all the purposes mentioned in the opening paragraph. The ultrafine particles are preferably used, however, for the manufacture of single or multicomponent materials or moulded bodies from such materials by the coating of substrates with said ultrafine particles.

When the ultrafine particles are used for said purpose, they are advantageously provided on the substrate together with a further material component, said component being provided by reactive deposition from an additional gas phase, i.e. by CVD, plasma-activated CVD or laser-induced CVD.

In a variant of the coating process, the ultrafine particles are first provided and then solidified by means of CVI=chemical vapour infiltration.

Further, it is advantageous that the substrates are coated with ultrafine particles of various materials, the individual ultrafine particles consisting of either one material or of various materials, and the particles subsequently being sintered by a heat treatment and, thus, porously compacted.

A further possible application consists in that the ultrafine particles are provided without additional solidification in the form of crosslinked chain structures and chain ends which firmly adhere to the substrate surface.

CVI=chemical vapour infiltration means CVD inside the pores of a porous material, which can also be obtained by, for example, the deposition of agglomerates containing loose particle chains. In the case of agglomerates of chains of BaO, CaO and/or $Al_2O_3$—containing ultrafine particles, for example, $WF_6/H_2$ is used as the reactive gas for enveloping the particle chains. The porous layer is heated directly, inductively or by a laser to a temperature which is sufficiently high for thermal CVD. When the above agglomerates are deposited, an additional size selection is generally not desired, i.e. the process is simplified to a considerable extent. CVI can be used either as an isothermal process, i.e. the entire substrate is at a constant temperature, or as a temperature-gradient-CVI, i.e. the temperature gradient can generally be moved from the zone having the highest level of deposition towards "cold" inflowing reactive gas.

To obtain a filled pore structure, consisting of $4BaO \cdot CaO \cdot Al_2O_3$, in a W-matrix with a $Sc_2O_3+W$-coating layer which can suitably be used as a scandate hot cathode and the manufacture of which has the advantage that it can take place in a single deposition process from the gas phase, the target is composed of $4BaO \cdot CaO \cdot Al_2O_3$, in the last coating phase ultrafine particles being evaporated from a further target of $Sc_2O_3$ and tungsten being the further material component used to strenghten the porous structure, said tungsten being deposited through PCVD, CVD or CVI from $WF_6/H_2$ or another gaseous W-source. This is an example of the manufacture of alkaline earth-dispenser cathodes in general.

In the case of the method according to the invention, the material to be transferred is evaporated at a sufficiently high spot temperature by a laser beam having a high power density of $10^6$ to $10^9$ W/cm$^2$ in the target surface, either already ultrafine particles being evaporated or, in the vapour phase, ultrafine particles being formed from said material, which ultrafine particles are transported through a gas flow or thermophoretically to a cold substrate where they are deposited, or prior to deposition, possibly with the use of a plasma, they are additionally coated and deposited by means of a reactive deposition from the gas phase (CVD) or they are decomposed in a plasma and deposited on the substrate. It is alternatively possible to charge the ultrafine particles and carry out a directed transport operation by means of an electric field.

In the following, a more detailed description is given of the inventive method which is divided into the following four process steps: production, detection, transport and deposition of the ultrafine particles.

1) Production of Ultrafine Particles by Laser-Induced Evaporation

Important parameters for a controlled production of ultrafine particles by the action of a laser on a material surface are laser intensity I in the target surface
absorptivity $A(\lambda)$ of the surface
conductivity $\kappa$ of the material
melting and boiling point of the material
equilibrium partial pressures over the pure material as a function of the temperature.

First, a sufficiently high power density in excess of $10^6$ W/cm$^2$ has to be available in the target surface of the laser beam. In order to fulfil this condition, lasers having a corresponding power have to be used; suitable lasers are, for example, $CO_2$ lasers ($\lambda = 10.6$ μm), NdYAG lasers ($\lambda = 1.06$ μm) and KrF lasers ($\lambda = 0.250$ μm).

In combination with a focusing lens, the following power densities can be attained in the laser focus:

| | |
|---|---|
| $CO_2$ laser: | $10^8$ W/cm$^2$ |
| NdYAG laser: | $5.10^{11}$ W/cm$^2$ |
| KrF laser: | $2.10^{11}$ W/cm$^2$ |
| other excimer lasers (ArF, KrCl): | $2.10^{10}$ W/cm$^2$. |

These data refer to pulsed operation, however, a $CO_2$ laser having a sufficient CW power (approximately 100 W) can also be used to evaporate the material and produce the particles.

As regards the particle production, however, an important limitation is to be taken into account: above a material-dependent threshold intensity $I_s$ (for example in the case of Cu and $\lambda = 1.06$ μm:

$$I_S = 8.10^7 \text{ W/cm}^2$$

($T_P = 200$ nsec, where $T_P$ = pulse duration) or in the case of Al and $\lambda = 250$ nm: $I_S = 2.10^8$ W/cm$^2$) the absorptivity $A(\lambda)$ of the surface, which is already very low for metals in the near infrared region, rises in steps to 1 (anomalous absorption). This is caused by the fact that of from a certain power density a gas discharge takes place in the vapour over the surface and the plasma thus formed fully absorbs the laser power. In the case of a further increase of the power density, the radiation intensity is finally completely screened from the surface and the plasma is released and rapidly moves in the direction of the location where the laser beam impinges (G. Herziger, E. W. Kreutz: "Fundametals of Laser Micromachining of Metals" Proc. Int. Conf. on Laser Processing and Diagnostics, Linz 1984, pp. 90–106; G. Herziger: "Technische Anwendungen von IR-Lasern in der thermischen Materialbearbeitung" Verhandlungen der DPG 7/1986, pp. 1735–1763).

Said level at which plasma screening occurs is undesired for the processing of the material because it renders the process uncontrollable. For the purpose of particle formation, however, also the customary power level is disadvantageous for the processing (for example in the case of Al $3.10^6$ W/cm$^2$ to $3.10^7$ W/cm$^2$ for $\lambda = 10.6$ μm), because the plasma again brings about a destruction and/or fractioning of ultrafine particles which are already present. On the other hand, however, the power density has to be sufficiently high for the evaporation and particle formation, i.e. in accordance with the invention, a proper control and adjustment of the power density in the target surface is required. The particle formation in the gas phase takes place with oversaturated vapour (i.e. when at the temperature T the partial pressure over the surface is clearly higher than the saturation vapour pressure) or small liquid droplets evaporate immediately, which is advantageous, in particular, with materials such as $Sc_2O_3$ which decompose in the gas phase.

However, since a laser intensity $I < I_S$ should be used it is advantageous, in particular for metals in the near IR region (NdYAG lasers and $CO_2$ lasers), to take further measures to increase the absorptivity and the effectiveness of the laser action.

In accordance with the invention, these measures are: roughening or grinding the metal surface, oxidizing the metal surface, so that through a higher initial power absorption a higher final temperature is attained, or exposing a porous moulded body to radiation. A further possibility of increasing the infrared absorption of metals consists in irradiating the target surface with a second laser having a low power in the visible range. As the laser action leads to a substantial change of the target surface, such as removal of material from the surface and the formation of holes and, hence, also to a temporal change of the quantity of material evaporated, either the laser beam or, relative to the laser beam, the substrate is continuously moved on according to a meander-shaped pattern so as to obtain constant particle quantities.

2) Particle Detection

Further below, a description will be given of the particle detection by means of a HeNe-laser beam by scattering at the particle surfaces, and of the resulting decrease in beam intensity. In the case of small particles, a mass spectrometer may alternatively be used for detection and charging (with e beam), or use may be made of a small degree of ionization. Further particle detection is possible by using the particle transport and the weighing of the target and the substrate after prolonged transport times.

3) Particle Transport

Examples of particle transport are given further below. The possibilities include: thermophoretically in the direction of lower temperature regions or the use of a transporting gas flow, for example, of Ar gas which is blown onto the target focus from a suitably shaped nozzle, or alternatively Kr, $N_2$, $O_2$ or, for example, Ar to which $O_2$ has been added as an additionally oxidizing gas. A further transport possibility consists in slightly charging the particles, for example, using an electron beam of low energy in the target area, followed by a further control of the particles by an electric and/or magnetic field. To use the first-mentioned thermodiffusion, it is advantageous to adjust a temperature drop in the gas phase by means of the following measures in accordance with the invention, which aim at forming a relatively cold gas hose between relatively hot outer regions, which hose extends (from the target spot) to the even colder substrate. Said measures are:

- heated guide walls with an inflow of relatively cold gas between them
- heating the edge of a flow hose by exposure to laser radiation of the wavelength $\lambda$ in a suitable gas phase having a strong resonance absorption at $\lambda$
- a cooled transport-gas nozzle and a laminar flow
- laser-gas cooling by stimulated emission from the excited state and a suitable wavelength at which only a a low degree of scattering by ultrafine particles takes place.

4) Particle Deposition

The particle deposition takes place through either thermodiffusion on a cold substrate or by means of charged particles and a voltage which is applied to the substrate electrode, or the particles are dissolved in a plasma or they are dissolved by means of a second $CO_2$ or NdYAG laser and deposited on a hot and/or suitably electrically poled substrate.

5) Applications

A typical application is the otherwise impossible particle transport of hardly volatile alkali and alkaline earth compounds, for example, for CVD (PCVD) applications. Unlike the conventional "powder ceramic" manufacturing methods, this enables, for the first time, a complete manufacture of alkaline earth (Ba, Sr, Ca) dispenser cathodes such as, for example, I-cathodes through a controlled particle transport and particle deposition and, hence, also a gas-phase technique.

A further important field of application is formed by the novel superconductors on the basis of Ba, Y, La+-CuO, for which a new manufacturing method providing novel structuring possibilities is created by the inventive-method.

BRIEF DESCRIPTION OF THE DRAWING

The invention will be described in greater detail by means of a few exemplary embodiments and with reference to the accompanying drawings, in which.

DETAILED DESCRIPTION OF THE PREFERRED EMBODIMENTS

Figure 1:
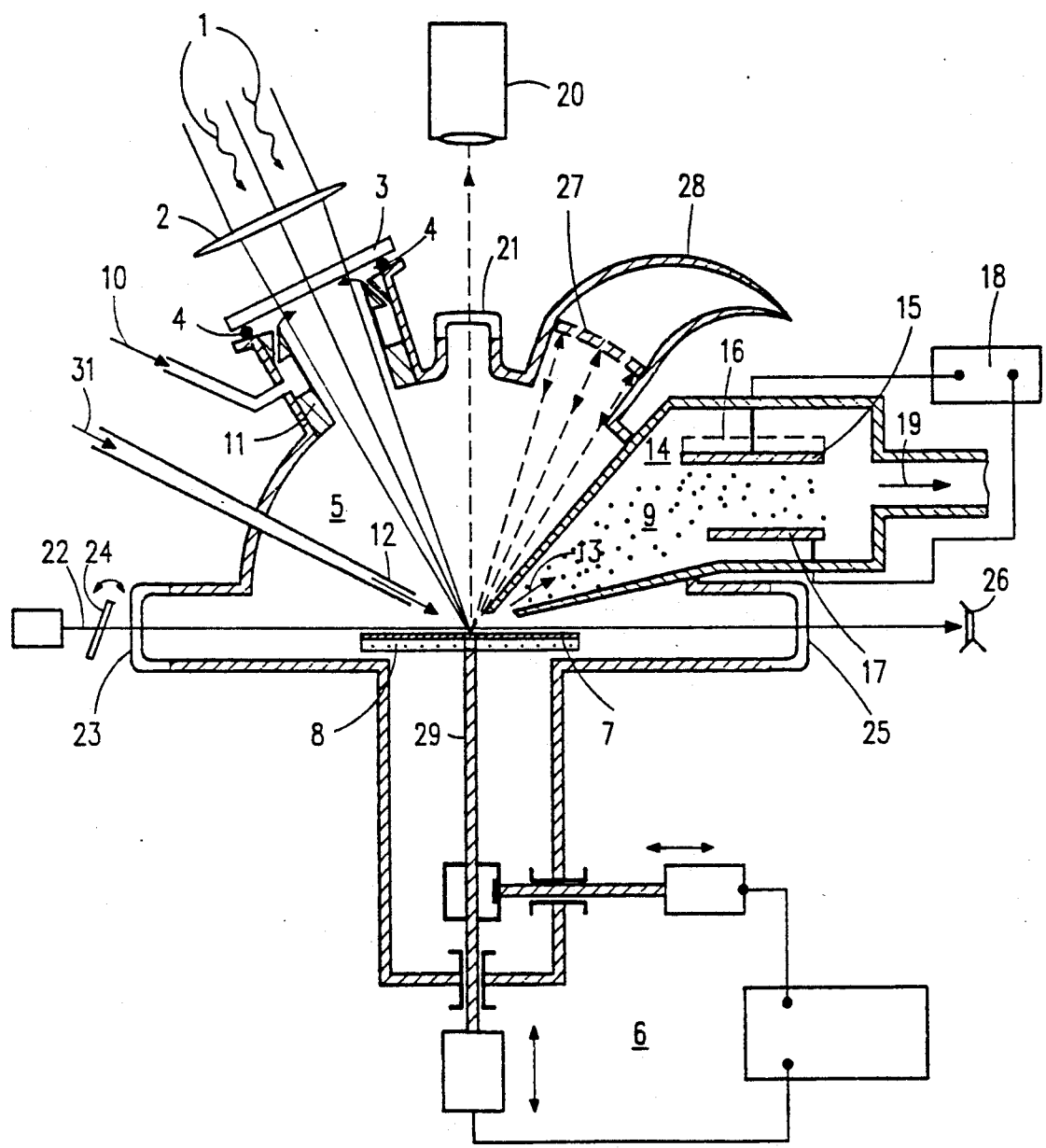
FIG. 1 is a diagrammatic basic representation of laser-induced particle production.

As shown in FIG. 1, a $CO_2$ laser beam 1 having a wavelength $\lambda = 10.6$ $\mu$m (or a NdYAG laser beam, $\lambda = 1.06$ $\mu$m) passes through a focusing lens 2, for example, of ZnSe, (plano-convex or rather with a positive meniscus) and a IR-window 3, for example, of ZnSe having a sealing ring 4, into a chamber 5 and impinges (slightly obliquely) in the focus on a three-dimensionally controlled movable target plate 7 (the control being exercised by a diagrammatically represented motor-program-control 6). If necessary, the target plate can be additionally heated by means of an auxiliary heating device 8. At a power density of $10^6$ to $10^7$ W/cm$^2$ in the focus, the target material is heated at said point to a temperature above the melting point, evaporates partly, and particles 9 are formed in the highly oversaturated vapour phase or particles 9 directly evaporate off the surface. The ZnSe window 3 is kept clear of any coatings formed thereon by evaporation by means of an inert rinsing gas (arrow 10), (insert 11 having nozzles for rinsing gas).

The ultrafine particles 9 formed directly above the spot are transported by an inert transport gas 31, which is blown onto the target surface through a nozzle 12, through a heated outlet (arrow 13) to a deposition chamber 14 where the particles are incident on a cooled substrate electrode 15 (cooling 16). A direct current or alternating current glow discharge (voltage supply 18) can optionally be ignited between substrate electrode 15 and counter electrode 17, and, additionally, reactive gases for CVD or PCVD can be introduced into the deposition chamber 14. Transport gases and reactive gases or gaseous reaction products are aspirated (arrow 19) to a gas discharge device by a pump, and a pressure of approximately 1 to 100 hPa is maintained in the deposition chamber 14, while the pressure in the evaporation chamber 5 is approximately 100 to 1000 hPa (exit pressure in the gas nozzle: several $10^5$ Pa). The spot temperature is measured perpendicularly to the target surface of the laser beam by means of an infrared pyrometer 20 (inspection glass 21) and readjusted through, for example, the positioning of the focus. In order to obtain a particle flow which is constant in time and to avoid a substantial local change of the surface geometry due to the unintended formation of holes, the target 7 is continuously moved on in a computer-controlled manner, for example, according to a meander-shaped pattern. For example, a He-Ne laser beam 22 which enters the chamber 5 through a rinsed window 23 (rinsing device not shown) and which is led over the heated spot in a direction parallel to the target plate 7 (beam height over the plate being adjustable through, for example, a rotatable plane-parallel plate 24 in front of the window 23) and which passes through an, also rinsed, inspection glass 25 and is then incident on a photodetector 26, can be used to detect the particles formed through light scattering and, hence, a reduction in intensity of the HeNe beam.

The part of the $CO_2$ laser beam which is reflected by the target surface is either reflected back to the focus by a curved spherical concave mirror 27 or, in the case of surfaces having a relatively high degree of scattering, absorbed in an absorber 28 (for example Wood's horn) or "sump". To avoid anisotropies during the evaporation with a linearly polarized beam, the polarization of the IR laser beam is suitably circular. However, it is alternatively possible to use a linearly polarized beam (see FIG. 3), and angles of incidence other than that mentioned in FIG. 1 can also be used. Further, the plasma chamber (PCVD, CVD) and the deposition chamber may be arranged consecutively in a spatially separated manner.

A variant of the arrangement shown in FIG. 1 consists in that the target plate 7 is a round "dish" which can be rotated about the axis 29 at the angular velocity, said axis additionally being linearly movable in a direction parallel to the laser beam spot. Said spot is generally eccentric.

Figure 2:
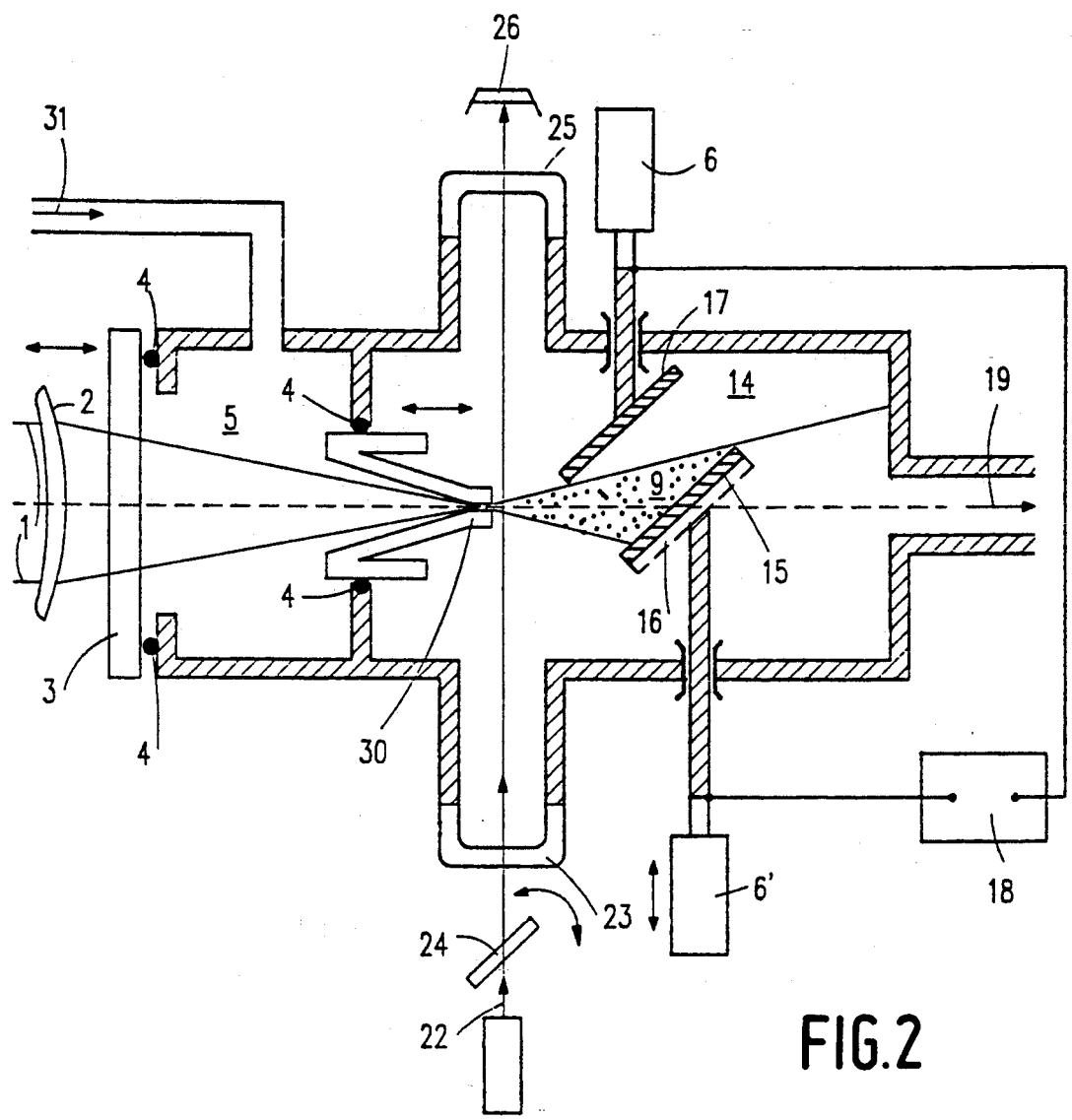
FIG. 2 is a diagrammatic representation of laser-induced particle production in accordance with the invention.
Figure 2A:
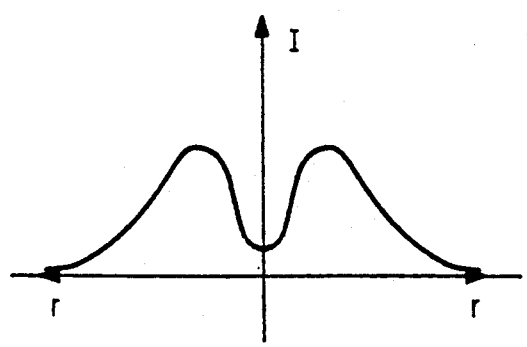
FIG. 2a shows an intensity profile of a laser beam, FIGS. 3a and 3b diagrammatically show a cross-sectional view (FIG. 3a) and a further cross-sectional view (FIG. 3b) perpendicularly to the cross-section of FIG. 3a, respectively, of laser-induced particle production according to the invention.

An arrangement in accordance with the invention is shown in FIG. 2. In this case, the NdYAG or $CO_2$ laser beam 1 does not impinge substantially perpendicularly as in FIG. 1, but is focused into a target nozzle 30 in such a manner that it is grazingly incident in the focal region, said target nozzle being narrowed correspondingly. An inert (or reactive) transport gas 31 is introduced into the target chamber 5 and flows through the target nozzle 30 into the deposition chamber 14, thereby transporting the particles 9 formed in (and behind) the nozzle to the substrate surface 15. Efficaciously, the IR laser beam (or UV laser beam) 1 is circularly polarized and has, preferably, an annular or "volcano"-shaped intensity profile, as, in the case of for example a $CO_2$ laser, can be readily obtained by slightly dejusting (FIG. 2a, where I is intensity, r is radius), instead of a gauss-shaped or box-shaped radial intensity profile. As a result thereof, slightly larger conical target apertures can also be used.

The grazing incidence has the advantage of an up to 50 times higher electric field strength at the surface in comparison with a perpendicular incidence, but, of course, it has the disadvantage that the surface intensity decreases according as the angle of incidence becomes smaller. The conical nozzle insert serving as the target can be moved in the direction of incidence of the beam through a linear feedthrough, not shown in FIG. 2, while sliding over sealing rings 4. A focus displacement can also be attained by a linear displacement of the entrance collecting lens 2 on the axis of radiation.

For example, a He—Ne laser beam 22 is irradiated immediately behind the conical nozzle aperture for the purpose of particle detection, and the particle formation is registered through an intensity reduction of the beam. The substrate electrode 15 on which the particles-entraining beam is incident, is provided with a variable temperature control 16 device (cooling or heating) and can be moved linearly in all three spatial directions (device 6'). A counter electrode 17 enables a direct or alternating voltage (voltage supply 18) to be applied between said electrode and the substrate 15, thereby permitting the formation of a glow discharge. Reactive gases may be additionally introduced (not shown) and the particles can be coated by CVD or PCVD or be dissolved in the plasma and deposited on the substrate.

Figure 3A:
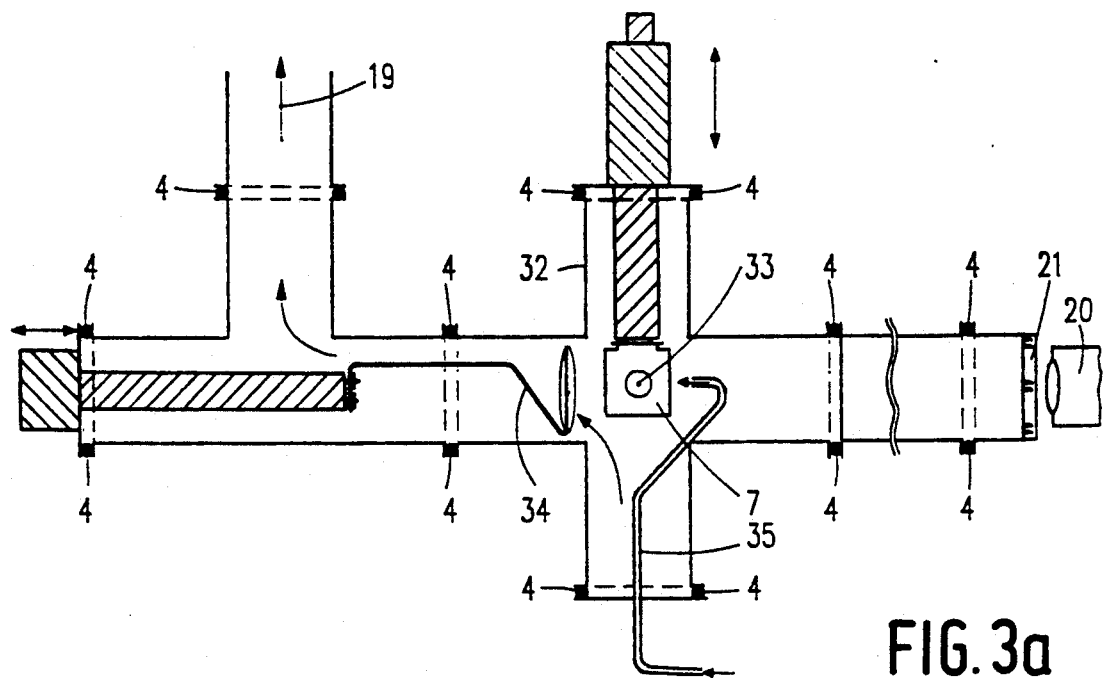
Figure 3B:
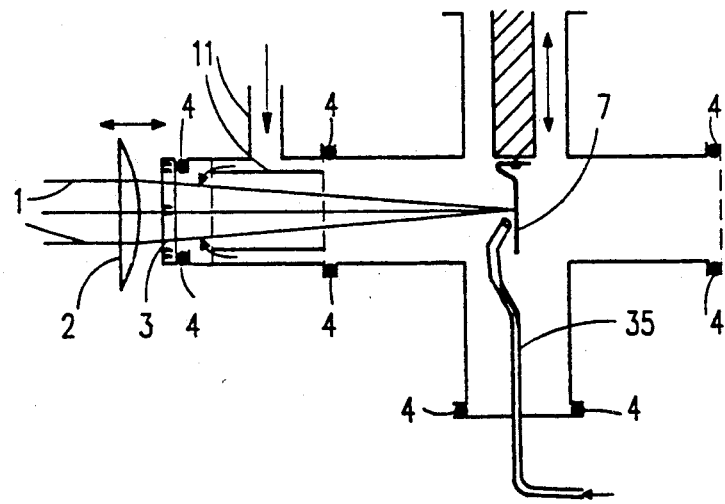

A further arrangement is shown in FIGS. 3a and 3b: the target 7 is a thin, linearly movable metal sheet on which the $CO_2$ laser beam 1 impinges in the focus at a slightly oblique angle relative to the normal to the surface, an adjustment of the focus being attained by a relative movement of the ZnSe collecting lens (Ge collecting lens) 2 in the direction of the beam axis. Retro-reflections of the laser beam and, hence, possible power fluctuations are precluded by selecting an angle of several degrees formed between the beam axis and the normal to the target.

Moreover, the beam-entrance window 3 (ZnSe) is rinsed on the inside with inert rinsing gas from a nozzle insert 11 to avoid that the window is coated. By the way, the target 7 is arranged in the centre of a three-dimensional cross piece 32. The temperature of the focus is controlled with a pyrometer 20 by measuring the temperature on the backside of the metal sheet (at the location of the focus 33) and, in this manner, the focus is generally readjusted at the maximum temperature. A collector plate 34 is arranged opposite the target 7 in the direction of pumping 19, and covers, in a version in accordance with the invention, almost the entire cross-section of the pump, with the exception of a central round diaphragm aperture behind which there is the actual substrate. In addition, a particle exhaust in the direction of the collector can be attained through a transport-gas nozzle 35.

Figure 4A:
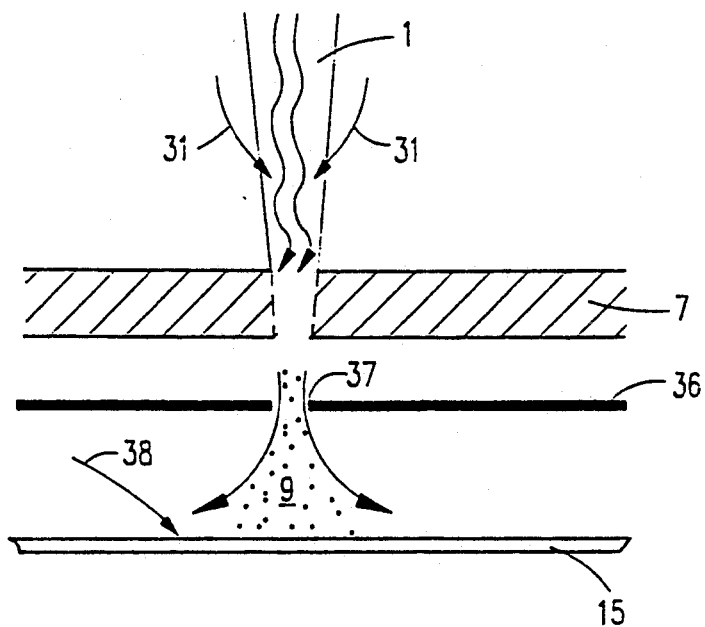
FIGS. 4a and 4b show a diagrammatic cross-sectional view (FIG. 4a) and a top view (FIG. 4b), respectively, of an arrangement for embedding ultrafine particles in a CVD layer.
Figure 4B:
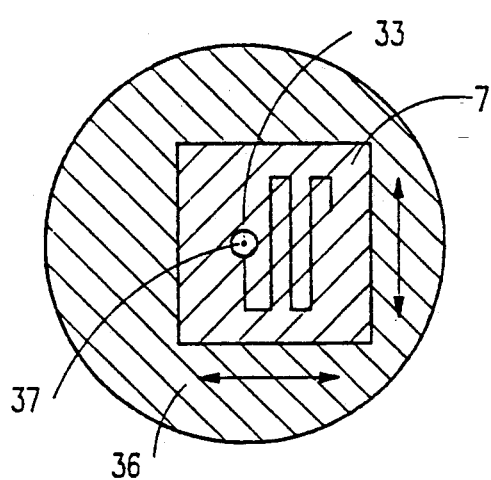

An arrangement for embedding ultrafine particles of, for example, BaO, $Sc_2O_3$ or $SiO_2$ in a tungsten layer (or other metal layer) which is deposited by, for example, thermal CVD is shown in FIGS. 4a and 4b. In said Figures, arrows 31 denote an inert transport gas, for example argon. Between a (x-y) movable target 7 of, for example, $SiO_2$, BaO or $Sc_2O_3$ and a heated substrate 15 there is arranged a fixed diaphragm 36 having an aperture 37 for a forced transport gas flow.

Ultrafine particles are not only evaporated off the surface of the target, but the target is completely perforated by the laser beam and the continuous supply of ultrafine particles takes place by a relative movement of the target in a direction perpendicularly to the fixed laser beam (-focus). The diaphragm behind the target, which diaphragm is also fixed and has an aperture at the area of the laser beam, ensures that the inert transport gas escapes only through said aperture, in which at the time ultrafine particles are being evaporated, and not through the aperture already present in the target/-sedimentation chamber.

The inert transport gas 31 transporting the ultrafine particles 9 of target material (for example BaO, $Sc_2O_3$) then impinges on a substrate 15 on which tungsten is deposited from $WF_6+H_2$ (arrow 38), for example, through CVD, in this case thermal CVD, which grows around the ultrafine particles which also impinge on the substrate, so that a material structure of W with BaO/$Sc_2O_3$ particle inclusions is formed.

Using such an arrangement, in particular, alkaline earth dispenser cathodes can be manufactured in a single continuous process which replaces the large number of individual manufacturing steps necessary so far, such as powder compacting and sintering to a porous W-matrix, impregnating and applying the coating layer. By virtue thereof, I-cathodes can be mass-produced.

Figure 4C:
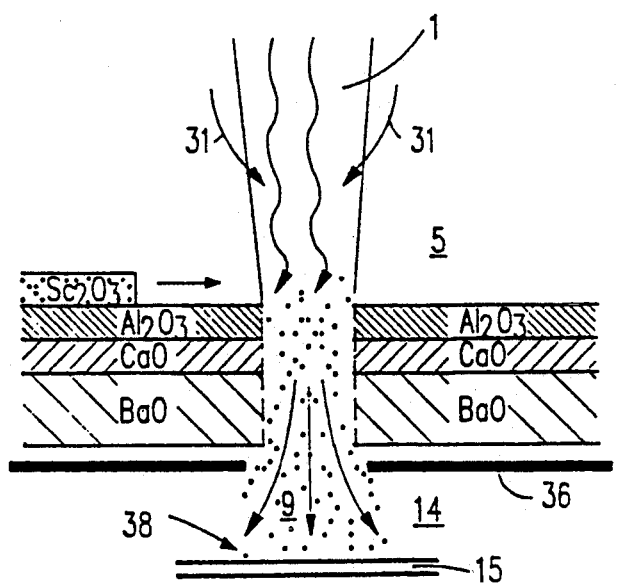
FIG. 4c is a variant of the embedding arrangements in FIGS. 4a and 4b.

The construction is shown in FIG. 4c: in the arrangement shown therein, the target 7 according to FIGS. 4a and 4b, which target may also be directly, loosely arranged on the diaphragm 36, is replaced by a target of four different layers.

Three target plates, consisting of BaO (1 mm thick), CaO (0.5 mm thick) and $Al_2O_3$ (0.5 mm thick), respectively, are loosely stacked on top of each other and are moved relative to the laser spot, for example, according to a meander-shaped pattern by two linear guiding means. In general, said targets are relatively porous moulded bodies. A plate of $Sc_2O_3$ which can also be moved in the x-y directions independently of said targets is arranged on top thereof, only in the last deposition phase said plate being moved over the laser spot.

Instead of the three different plates of BaO, CaO and $Al_2O_3$, it is alternatively possible to use a target obtained by moulding, which consists of a mixture of BaO:CaO:$Al_2O_3$ in a ratio of 4:1:1, respectively.

Subsequently, for example, the following process parameters are adjusted: substrate temperature 500° to 600° C., $WF_6$ flow 50 sccm, $H_2$ flow 500 sccm, Ar flow 300 sccm, pressure in the deposition part of the chamber 14, 10 to 20 hpa, pressure of the incoming transport gas in the area 5, 100 to 200 hPa, laser power 50 W, focal length of the focusing lens 5.2 cm. At a target-material removal rate of 0.07 g/min. and a W-deposition rate of approximately 0.3 g/min., 1 mm thick I-cathode layers on a surface of approximately 1 $cm^2$ can be manufactured in a coating time of approximately 10 min. Besides, in the last minute of the coating time the $Sc_2O_3$ target plate is moved into the laser spot.

In general, the substrate is removed either mechanically or by selective etching or by using a substrate on which the W-CVD+ particle-embedding layer does not adhere.

Figure 5:
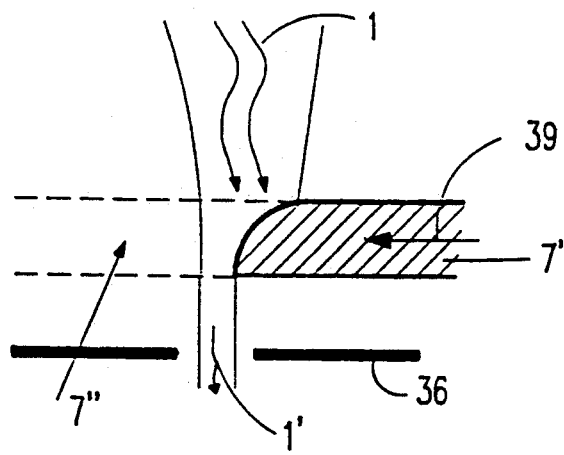
FIG. 5 is a diagrammatic representation of the action of a laser beam on a target.

FIG. 5 shows how target material struck by a laser beam 1 is fully removed in the direction of radiation, the largest part of the beam interacting with the target and only a small part 1' bypassing the remaining target 7'. Thus, a removal of material at the periphery takes place as the laser beam is moved relative to the target in the peripheral zone of the target and along the edge thereof(arrow 39) and when the laser parameters such as power, power density and relative velocity are suitably adjusted the target edge is completely removed. The target portion which has already been removed is referenced 7".

Figure 6:
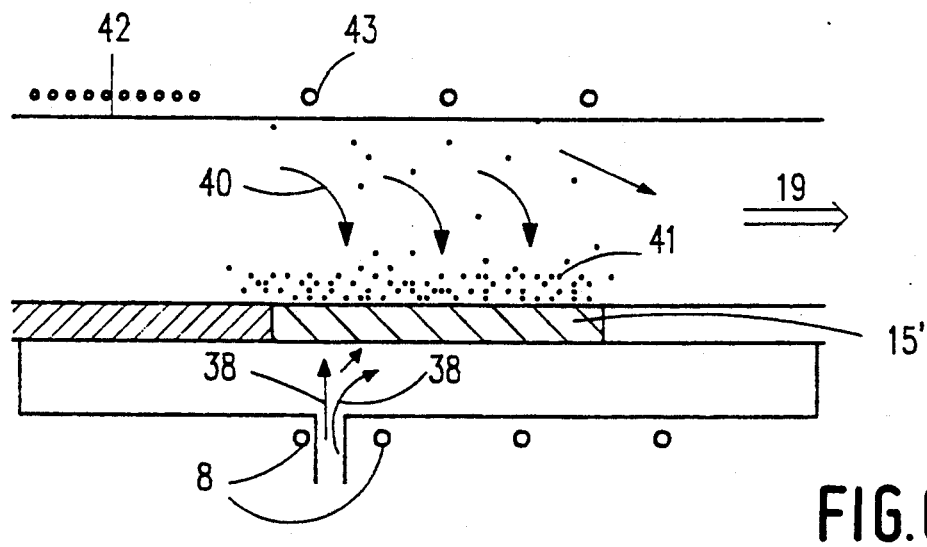
FIGS. 6 and 7 are diagrammatic representations of CVI processes.
Figure 7:
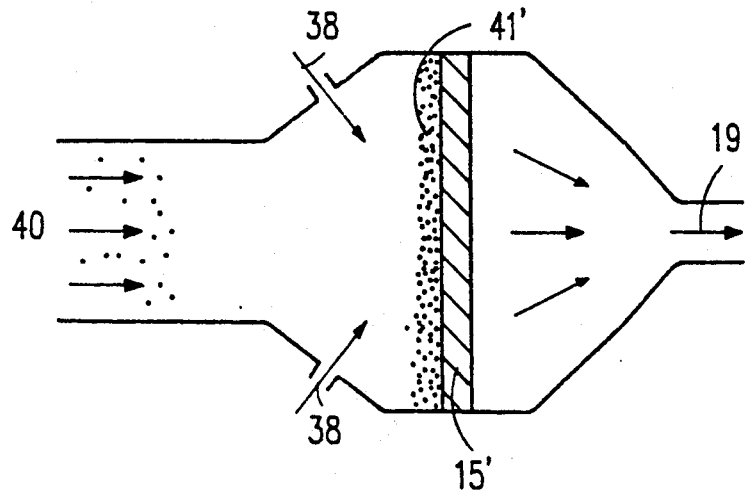

FIGS. 6 and 7 are diagrammatic representations of chemical vapour infiltration CVI processes. A layer 41 of ultrafine particles (FIG. 6) or chain-containing agglomerates 41' (FIG. 7) is deposited on a porous substrate 15' from a particle flow 40 with inert carrier gas. A reactive gas, for example $WF_6/H_2$, flows through (arrow 38) the layers 41 and 41', respectively, and the porous substrate 15'. Reference numeral 42 denotes a resistive heating coil and reference numeral 43 denotes a coil for inductively heating.

In FIG. 7, the following material flows can be exchanged: 19 for 38 when the direction is reversed; 38 for 40; 40 for 19 when the direction is reversed.

The deposition of agglomerates of ultrafine particles and the CVI-solidification can also be carried out consecutively.

We claim:

1. Method of manufacturing ultrafine particles which are produced from a target by laser beam evaporation, characterized in that the laser beam is directed to the target in such a manner that the removal of the target material takes place in the direction of the laser beam.

2. A method as claimed in claim 1, characterized in that the ultrafine particles which are being evaporated flow off through a hole in the target and, pass through an supplemental diaphragm.

3. A method as claimed in claim 1, characterized in that prior to the removal operation, the surface of the target is roughened, ground or oxidized.

4. A method as claimed in claim 1, characterized in that a porous moulded body is used as the target.

5. A method as claimed in claim 1, characterized in that various material components are simultaneously evaporated and ultrafine particles are produced therefrom.

6. A method as claimed in claim 1, characterized in that the target is heated directly or indirectly.

7. A method as claimed in claim 1, characterized in that the laser beam evaporation from the target takes place in front of, in or behind the focus of a focused beam.

8. A method as claimed in claim 7, characterized in that the focusing takes place inside or outside a target chamber by using a spherical focusing mirror which is rinsed with an inert gas.

9. A method as claimed in claim 1, characterized in that the laser beam exhibits a power profile on the target surface, which consists of a narrow region of material removal with a high power and a wider heating region with a lower power.

10. A method as claimed in claim 1, characterized in that the ultrafine particles are transferred to a collecting chamber or a substrate by a generally inert transport gas and, if necessary, an intermediate size selection.

11. A method as claimed in claim 1, characterized in that the ultrafine particles are given a size distribution with a standard deviation of maximally 10% from the average diameter, or in that only selected particles of said size distribution, including their agglomerates, reach the collecting chamber or the substrate.

12. A method as claimed in claim 1 characterized in that the desired dosage of the ultrafine particles is obtained by adjusting the values of the laser-power density on the target surface, the size of the spot, the relative velocity between target and laser beam, the overall pressure in the target chamber and/or by dividing the carrier gas flow.

13. A method as claimed in claim 12, characterized in that the said values are kept constant throughout the process.

14. A method as claimed in claim 12, characterized in that the overall pressure in the target chamber is adjusted to be low so that the maximum of the size distribution of the ultrafine particles coincides with the particle size to be selected.

15. A method as claimed in claim 1, characterized in that the ultrafine particles are given charges of the same sign, and in the case of oxidic particles or insulators, said particles or insulators are preferably previously coated with, respectively, a thin, only a few monolayers thick, electrically conducting or metallic surface layer.

16. A method as claimed in claim 15, characterized in that the material component enveloping the ultrafine particles is a material whose solid solubility in the particle material is negligibly small.

17. The method claimed in claim 1, characterized in that during the coating of the substrate, the ultrafine particles are applied together with a further material component, said component being provided by reactive deposition from an additional gas phase, i.e. by CVD, plasma-activated CVD or laser-induced CVD.

18. The method as claimed in claim 1, characterized in that first the ultrafine particles are provided and then a solidification by means of CVI=chemical vapour infiltration takes place.

19. The method as claimed in claim 1, characterized in that the substrates are coated with ultrafrne particles of various materials, the single ultrafine particles consisting of only one material or of various materials, and said particles subsequently being sintered by a heat treatment and, thus, porously compacted.

20. The method as claimed in claim 1, characterized in that ultrafine particles are provided without additional solidification in the form of crosslinked chain structures and chain ends which firmly adhere to the substrate surface.

21. The method as claimed in claim 1, characterized in that the target is composed of $4BaO \cdot CaO \cdot Al_2O_3$, and in the last coating phase ultrafine particles are evaporated from a further target of $Sc_2O_3$ and the further material component used to solidify the porous structure is tungsten which is deposited through PCVD, CVD or CVI from $WF_6/H_2$ or another gaseous W-source.

* * * * *